United States Patent [19]

Held

[11] Patent Number: 4,687,528

[45] Date of Patent: Aug. 18, 1987

[54] PROCESS AND DEVICE FOR FABRICATION OF COPPER-LINED LAMINATES

[76] Inventor: Kurt Held, Alte Str. 1, D-7218 Trossingen 2, Fed. Rep. of Germany

[21] Appl. No.: 855,791

[22] Filed: Apr. 24, 1986

[30] Foreign Application Priority Data

May 2, 1985 [DE] Fed. Rep. of Germany ....... 3515629

[51] Int. Cl.[4] .............................................. C25D 5/00
[52] U.S. Cl. .................................. 156/150; 156/192; 156/233; 156/269; 156/307.7; 156/324; 156/344; 156/536; 156/583.5; 156/584; 204/35.1
[58] Field of Search ............... 156/150, 192, 233, 269, 156/307.7, 324, 344, 536, 583.5, 584; 204/35.1, 38.5; 428/246, 263, 285

[56] References Cited

U.S. PATENT DOCUMENTS

| | | | |
|---|---|---|---|
| 3,043,728 | 7/1962 | Stauffer | 156/233 X |
| 3,660,190 | 5/1972 | Stroszynski | 156/150 |
| 3,984,598 | 10/1976 | Sarazin et al. | 156/150 X |
| 4,176,035 | 11/1979 | Pedone | 204/205 |
| 4,579,612 | 4/1986 | Held | 156/324 X |
| 4,587,166 | 5/1986 | Garrison | 156/233 X |
| 4,599,128 | 7/1986 | Held | 156/324 X |

FOREIGN PATENT DOCUMENTS

| | | |
|---|---|---|
| 2820196 | 11/1979 | Fed. Rep. of Germany . |
| 2235522 | 3/1980 | Fed. Rep. of Germany . |
| 3023827 | 2/1982 | Fed. Rep. of Germany . |
| 3342678 | 6/1985 | Fed. Rep. of Germany . |
| 3413434 | 10/1985 | Fed. Rep. of Germany . |

Primary Examiner—Robert A. Dawson
Attorney, Agent, or Firm—Toren, McGeady & Associates

[57] ABSTRACT

Copper-lined laminates are formed by galvanically depositing a copper layer on a portion of at least one of two endless press bands arranged to define a reaction zone between two generally parallel sides thereof. After depositing of the copper layer, the press bands are moved through the reaction zone and resin impregnated plastic webs are also moved between the press bands in the reaction zone to form a laminated structure which is then stripped from the press bands to form the copper-lined laminates.

24 Claims, 4 Drawing Figures

PROCESS AND DEVICE FOR FABRICATION OF COPPER-LINED LAMINATES

The present invention is directed to a process for fabricating copper-lined laminates and to apparatus for performing this process.

Copper-lined laminates, also known as electrolaminates, serve as the basic material for printed circuit boards and consist of a core of several layers of insulating material impregnated with precondensed resin. In the formation of these layers, there is usually utilized laminated papers impregnated with phenolic resin or glass fiber tissues impregnated with epoxy resin, the so-called prepreg. An electrolytically deposited copper foil with a high degree of purity is located on one or both surfaces of the core. The prepreg together with a copper foil is molded with application of heat into the electrolaminate.

The basic materials for fabrication of electrolaminates, meaning the resin impregnated core layers as well as the copper foil, are available in the form of a web on rollers. The fabrication of the electrically deposited copper foils is done with the help of a drum from high grade steel immersed into a bath with a portion of its surface, which contains copper ions, in solution. An anode lying opposite the drum is located in the bath. The drum performs the function of a cathode in the circuit. Because of the electrical field located between the anode and the cathode, copper ions are precipitated on the portion of the drum surface located in the bath. The copper foil can be continuously drawn off from the uniformly rotating drum and can be rolled up (see G. Leonida, Handbook of Printed Circuit Design, Manufacture, Components & Assembly, published by Electrochemical Publications Limited, 1981). Processes have also become known in which the copper foil is not precipitated upon rotating drums, but rather, on strip-shaped bands (see DE-OS 28 39 481).

In the continuous production of electrolaminates, copper foils and layered material webs in rolls are continuously wound off by unwinding units. They are reconducted with the same velocity depending upon the structure of the electrolaminate and they are molded in a double band press into the electrolaminates. This state of the art is exemplified in DE-OS 33 07 057.

A disadvantage of this known process is the fact that it involves a two-stage action. The copper foils are precipitated electrolytically, as has been described, and they are subsequently rolled up and stored for a time until they are molded with the laminated material. In the course of this, it is unavoidable that, during the storage and particularly during the unwinding of the copper foil in front of the double band press, dust particles deposit themselves on the surface of the copper foil because of electrostatic attraction. In particular, those dust particles which are located upon that surface of the copper foil which faces away from the laminate result in low quality electrolaminates since they are pressed into the surface of the copper foil during the molding process, thus creating defects. In the process described in the aforementioned prior art document, wipers are arranged in front of the double band press for the purpose of removing the dust prior to inlet into the double band press. However, it has been shown that this feature is unable to remove all of the adhering dust.

An additional disadvantage inherent in this process is that it does not permit the molding of ultrathin copper foils. These are copper foils with a thickness of less than 10 $\mu$m. Such ultrathin copper foils can be handled only with great difficulty since they are extremely sensitive and are very much in danger of tearing during the continuous unwinding from the roll. Apart from that, dust deposits on the copper foil surface have in such cases a much more pronounced effect. On the other hand, utilization of such ultrathin copper foils is, in itself, desirable since, in the course of further processing of the electrolaminate into printed circuit boards, the etching time as well as the material consumption is considerably reduced. During fabrication of very thin conductor webs with a high conductor web density, no thick copper foil is usable because of the undercut of the conductor webs, and the utilization of ultrathin foils is therefore unavoidable.

A further difficulty which occurs particularly with the use of ultrathin copper foils involves the formation of creases by suppressed heat expansion of the foil which is very difficult to avoid during the molding process. Equally, the existence of the finest pores in the copper foil cannot be avoided. These micropores permit a flowthrough of the melted epoxy resin during the molding process on the surface of the press band. The resin which flows out spreads itself in the gap between the foil and the press band and covers the copper foil in the finished electrolaminates against the action of etching agents which thus results in considerably greater defects than the pores alone.

At least when molding the laminate materials with ultrathin copper foil in discontinuous single platen or multiplaten presses into an electrolaminate plate, it is known to deposit the ultrathin foils during the electrolytic process upon a supporting base which, for instance, may consist of an aluminum web (see DE-AS 24 13 669). The ultrathin copper foil is subsequently molded together with a supporting base and the laminate material. After molding, the supporting base is again pulled off from the copper foil surface. It is disadvantageous that in this process, an expensive supporting base is also necessary, but which can no longer be utilized after the molding operation because it is scrap.

The present invention is directed toward providing a continuously functioning process with area pressure which avoids intermediate storage of the sensitive copper foils, very greatly diminishes the danger of defects through dust, crease or pore formation in the copper foil and also permits the utilization of ultrathin copper foils without the otherwise usual expensive carriers or supports.

SUMMARY OF THE INVENTION

The present invention may be described as a process for the fabrication of copper-lined laminates in which resin impregnated laminated plastic webs are brought together with one or two copper foils and are subsequently guided in such a way between two endless press bands moving with equivalent speed so that the copper foil will rest on one side or the other of the laminated plastic core as well as at the press bands and wherein this laminated structure is cured in a reaction zone lying between the two press bands under the action of heat and pressure. The invention is particularly characterized in that a copper layer is galvanically deposited on a portion of one or both of the press bands facing the laminated plastic and located in front of the reaction zone in the feed direction of the continuously moving press bands, that it is conveyed by the press bands into the reaction zone and that it is molded in the reaction zone together with laminated plastic webs.

In particular, the advantages provided by the present invention consist in that the continuous process no longer proceeds in two stages, but rather, in one stage. With this, intermediate storage is unnecessary and additional handling of the copper foil and the consequent dangers of damage of the copper foil are eliminated. Since the surface of the copper foil lying outside at the finished electrolaminate is continuously covered by the press band until after the molding step, no dust particles can deposit themselves on this surface, and thus, the danger of defects in the electrolaminate is obviated. Because of the direct deposition of the copper foil on the press band, it achieves, during the deposition, the temperature of the press band, whereby formation of creases is avoided. Because of the advantageous use of the tampon galvanizing method, the danger of micropores in the copper foil is completely eliminated because of the permanent frictional stresses of the foil surface being deposited. The thin copper foil is continuously supported by the press band prior to the molding process, whereby additional support for the ultrathin copper foil is entirely unnecessary. The inventive process improves the quality of the product and decisively reduces its cost.

The various features of novelty which characterize the invention are pointed out with particularity in the claims annexed to and forming a part of this disclosure. For a better understanding of the invention, its operating advantages and specific objectives attained by its use, reference should be had to the drawings and descriptive matter in which there is illustrated and described the preferred embodiments of the invention.

DETAILED DESCRIPTION OF THE PREFERRED EMBODIMENTS

Figure 1:
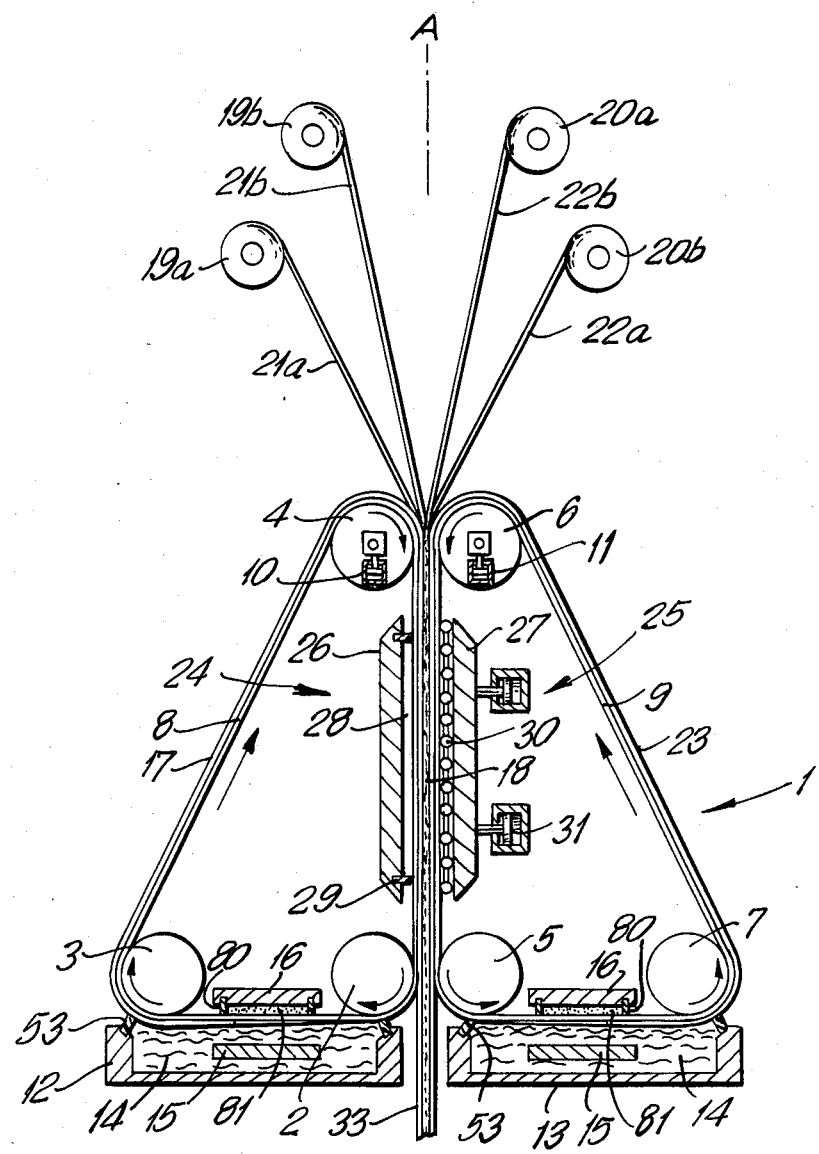
FIG. 1 is a schematic diagram showing a device for deposition of the copper foil and molding into an electrolaminate.
Figure 1:
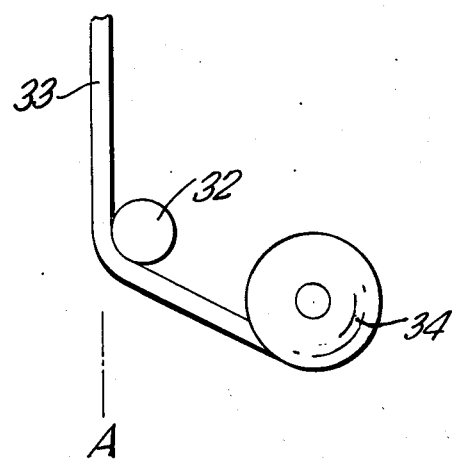
Figure 4:
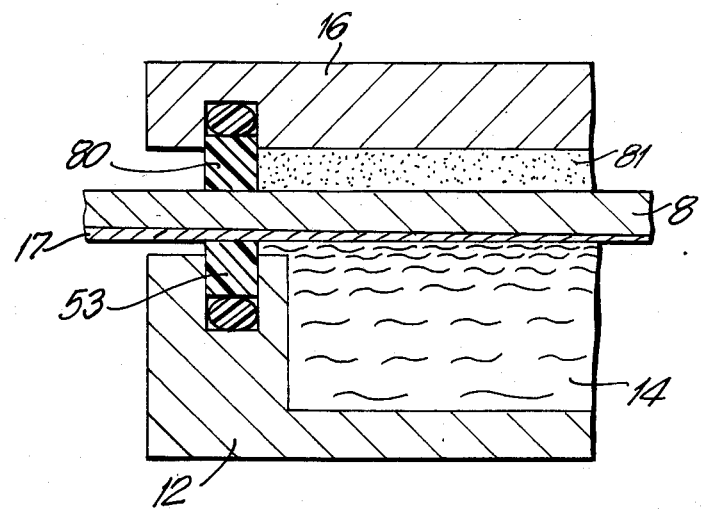
FIG. 4 is a sectional view showing a magnified partial segment from FIG. 1 for transmitting the voltage onto the press band by means of mercury.

Referring to the drawings and particularly to FIGS. 1 and 4, there is shown a double band press 1 positioned vertically so that its longitudinal axis is vertically oriented. This double band press 1 consists of a pair of juxtaposed press band units 24 and 25, each including, respectively, a press band 8, 9. The double band press 1, however, comprises, contrary to a conventional double band press, not four, but rather, six reversing drums 2, 3, 4, 5, 6, 7. Three of these reversing drums 2, 3, 4, respectively, are arranged in the press band unit 24 in such a way that they are seated at the corners of a right triangle, whereby the right angle is located at the reversing drum 2. The press band 8 is stretched across the three reversing drums and consists of a high tensile special steel. This arrangement is repeated in mirror fashion with respect to line A—A along the vertical cathetus of a triangle in the press band unit 24, wherein the arrangement consists of the reversing drums 5, 6, 7 and the press band 9. The press bands 8 and 9 are tensioned by means of hydraulic cylinders 10 and 11 which are fastened at the reversing drums 4 or 6.

The reversing drums rotate in accordance with the arrows drawn in FIG. 1 so that the press bands move in accordance with the direction of the arrows. Beneath the horizontal cathetus of the right triangle of unit 24, a trough 12 is arranged in such a way that it extends along the press band stretched between the reversing drums 2 and 3. The trough 12 is filled with an electrolyte 14 which consists of a solution of copper sulfate. The trough 12 is filled to such an extent that the outer surface of the press band 8 is covered with the electrolyte 14. A plate 15 is located in this trough which lies at an appropriate distance to that part of the outer surface of the press band which plunges into the trough 12. This plate 15 has the same width as the press band 8 and preferably a length corresponding to the shortest distance between the two peripheral points of the two reversing drums 2 and 3. An additional plate 16, which is the same size as the plate 15, lies on the inner surface of the press band 8 opposite the plate 15. The plate 16 lies a smaller distance from the press band 8. Liquid metal 81, for instance mercury is located in the space between the plate 16 and the inner surface of the press band 8 (also see FIG. 4). The edges of the plate 16 are equipped with sliding seals 80 resting at the press band inner surface so that the liquid metal cannot exit from this intermediate space. The trough 12 is equipped with seals 53.

The plates 15 and 16 consist of lead. The plate 15 located in the trough 12 is connected by a line with an adequately large cross section with the positive terminal of a direct current source so that it acts as an anode. The plate 16 fastened at the inner surface of the press band is connected with the negative terminal of the same direct voltage source so that that portion of the press band which glides along the plate 16 and has electrical contact with the plate 16 by means of the liquid metal 81 consisting of mercury acts as a cathode. In accordance with known electrolytic principles, copper atoms are precipitated from the electrolyte in the trough 12 on the point of the outer surface of the press band 8 acting as a cathode lying opposite the anode 15. Since the press band 8 continuously moves in the direction of the arrow, the thickness of the layer of the copper layer upon the surface of the band increases during the run-through. The trough 12 and the layer thickness reaches its maximum value at the reversing drum 3 when it leaves the trough 12. In accordance with the inventive process, the copper foil 17 galvanically deposited directly on the press band is then transported with the press band in the direction of the reaction zone 18 of the double band press.

The dimensioning of the direct voltage source which is usually constituted by a transformer from the mains with subsequent rectifier occurs in accordance with the familiar laws of electrolysis. In order to precipitate a uniform copper layer, the temperature of the electrolyte in the trough 12 is continuously controlled by a temperature sensor arranged in the trough and is maintained constant by the supply of an appropriately tempered electrolyte. At the same time, the used-up electrolyte is replenished by the supply of fresh electrolyte, since its concentration diminishes in accordance with precipitation of the copper ions on the surface of the band. Thus, the temperature as well as the concentration of the electrolyte is constant throughout the entire period of precipitation. Since the current density in the electrolysis path is also largely constant because of the plate-shaped design of the anode and cathode, the precipitation of a uniformly thick, homogeneous copper foil upon the upper surface of the band 8 succeeds overall, satisfying the high qualitative requirements which are demanded from electrolaminates.

In order to maintain the concentration of copper ions in the electrolyte automatically constant, there also exists the possibility of fabricating the plate 15 which is the anode from copper and utilizing an acid copper sulfate solution as electrolyte liquid. During the electrolytic process, as many copper ions from the anode go into a solution as are reduced from the electrolyte at the band upper surface and are precipitated there. In the course of this, evidently, the anode is used up and must be replaced from time to time by a new copper plate.

In order to keep the power losses as low as possible, the supply of the current to the anode and cathode must occur with the lowest possible resistance. Therefore, as is usual in electroplating, lines from material with the lowest electrical resistance, for instance, copper with appropriately large cross sections are utilized. These lines have not been drawn in FIG. 1 for reasons of clarity.

The press band 8 with the copper foil 17 galvanically deposited upon its surface moves with uniform velocity and leaves the electrolyte in the trough 12 at the reversing drum 3. The copper foil 17 is further conveyed to the reversing drum 4 with the press band 8. Along this distance between the two reversing drums 3 and 4, treatment of the upper surface which now lies above can occur for better adhesion of the copper foil 17 upon the core layer. Such a treatment, pertaining to the state of the art can, for instance, be etching of the copper foil upper surface or the deposition of brass coatings which are very susceptible to forming knots upon the upper surface of the copper foil lying opposite the press band.

The copper foil 17 resting upon the press band 8 is redirected in such a way at the reversing drum 4 that it now moves into the reaction zone 18 of the double band press 1. Webs 21a, 21b, 22a, 22b which consist of a glass fiber tissue impregnated with epoxy resin are introduced into the reaction zone 18 together with the copper foil. These glass fiber webs form the core of the electrolaminate and are continuously pulled off rolls 19a, 19b, 20a, 20b which are located in the vicinity of the reversing drums 4 and 6. In this embodiment, the core of the electrolaminate constitutes four layers of glass fiber webs. It is, however, also possible to use more or fewer glass fiber webs, according to desired thickness and stability of the electrolaminate. If it appears appropriate, all the take-off rolls can be located at the reversing drum 4 or 6, for distribution of the rolls with respect to the individual reversing drums according to available space. The copper foils, the glass fiber webs, as well as the electrolaminate, are drawn in exaggerated thickness when compared to the double band press for reasons of clarity of illustration.

If the electrolaminate is to be lined with copper foil on both sides, then at the bottom side of the press band unit 25 along the reversing drums 5 and 7, there is also installed a trough 13 consisting of the reversing drums 5, 6 and 7 and the press band 9. This trough 13 contains analogous to the trough 12 an electrolyte liquid 14 and an anode 15. A cathode 16 is also located opposite the anode on the inner side of the press band 9, while the current supply, as has been explained above, occurs by means of liquid mercury so that a copper foil 23 is precipitated upon the press band 9. This copper foil 23 together with the press band 9 is conveyed to the reversing drum 6 and is redirected there into the reaction zone 18. Evidently, if the electrolaminate is lined with copper foil on one side, it can be precipitated as described above on the press band unit 25 instead of on the press band unit 24.

The copper foil 17 is located on the press band 8 in the reaction zone 18 at whose surface facing away from the press band 8 lies the impregnated glass fiber web 21a. The remaining glass fiber webs in the sequence 21b, 22b and 22a are again stacked at this glass fiber web 21a. If it is desired to produce an electrolaminate lined on one side, then the second surface of the web 22a rests at the press band 9. FIG. 1 shows an electrolaminate lined on both sides, so that the web 22a rests at the surface of the copper foil 23. With the second surface, this copper foil 23, as already described, rests upon the press band 9. It has to be particularly pointed out that if a surface treatment for improving the adhesion of the copper foil upon the glass fiber core has occurred, the treated surface now rests upon the respective glass fiber web 21a or 22a.

Pressure is exerted in the reaction zone 18 on this material web stacked in accordance with the description. This pressure is applied by pressure plates 26, 27 hydraulically or mechanically upon the inner sides of the press bands 8, 9, i.e., on those sides of the press bands which face away from the copper foil 17, 23 and is transferred from there to the material webs. In transmitting hydraulic pressure, a fluid pressure medium, for instance, oil or air which can be subjected to pressure is introduced into the space 28 which is bounded on the sides by the pressure plate 26 and on the inside of the press band 8 towards the top or the bottom by the seal 29. For mechanical pressure transmittal, stationary rollers 30 are attached between the pressure plate 27 and the inner side of the press band 9. With the help of the hydraulic cylinder 31, the pressure plate 27 and with it the rollers 30 are applied against the inner side of the press band 9. The press stand, which absorbs the reaction forces emanating from the material well and in which the pressure plates 26, 27 as well as the two pressure band units 24 and 25 are supported has been omitted from the drawing for reasons of clarity. The epoxy resin is cured by the pressure exerted in the reaction zone 18 upon the material web possibly with the additional application of heat, while the material web moves continuously through the reaction zone 18, and the glass fiber webs 21a, 21b, 22b, 22a are joined into a solid unit to form the electrolaminate together with the adjoining copper foil 17, 23. Should this be required, the reaction zone can be subdivided into a heating zone beginning at the inlet into the double band press at the reversing drums 4 and 6 and into a cooling zone which ends at the outlet of the reversing drums 2 and 5. Thus, the material web can be cooled under pressure after curing of the resin which further improves the quality of the electrolaminates.

At the outlet from the double band press, at the reversing drums 2 and 5, the press bands 8 and 9 are again reversed and run into the troughs 12 and 13 of the electrolyte bath where they are again coated with a copper foil. With this, the cured electrolaminate, whose surface consists of copper foil 17 and 23, separates from the respective press band 8 and 9. As a rule, this separation does not present any difficulties, since the copper galvanized onto the press bands consisting of high grade steel does not adhere well on the press band surface and in particular does not form any joint with this surface.

After the electrolaminate web 33 has left the double band press, it is divided into individual plates corresponding to requirements by a revolving transverse saw which is not shown in FIG. 1. These copper lined plates can be stacked in pallets for further conveyance. Alternatively, if a flexible electrolaminate is desired, the electrolaminate web can be redirected or reversed at a reversing roller 32 and can be wound into a roll in a reroll unit 34.

Figure 2:
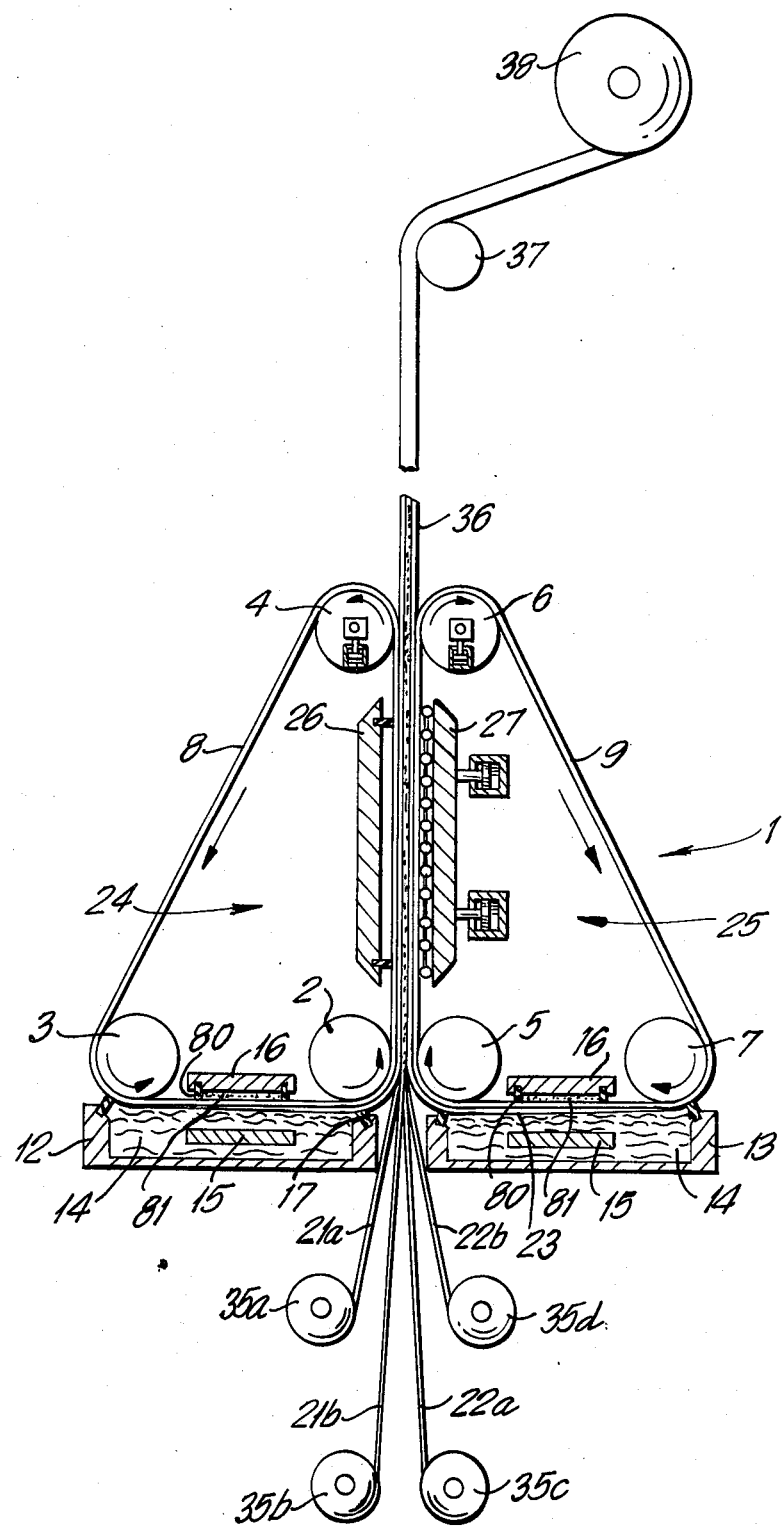
FIG. 2 is a schematic diagram showing a device according to FIG. 1 with the inlet and outlet of the double band press interchanged.

A device for performing the process of the present invention which functions in accordance with FIG. 1 and the above description in which, however, the inlet and outlet have been interchanged is shown in FIG. 2. The press bands 8 and 9 now move reverse to the arrows. Copper foils 17 and 23 reach their maximum thickness when leaving the electrolyte bath at the reversing drums 2 and 5. The glass fiber webs impregnated with resins are now rolled off from reels 35a, 35b, 35c and 35d which are located in the vicinity of the reversing drums 2 and 5, run into the inlets of the double band press at the reversing drums 2 and 5, and are molded in the reaction zone 18 with the copper foil 17 and 23. The electrolaminate web 36 leaves the double band press at the upper end at the reversing drums 4 and 6 and is, if a flexible electrolaminate is desired, redirected at the reversing rolls 37 in such a way that it can be wound up in the roll-off unit 38 upon a reel. Alternatively, the electrolaminate web 36 can be cut immediately into plates of the desired size behind the reversing drums 4 and 6.

Figure 3:
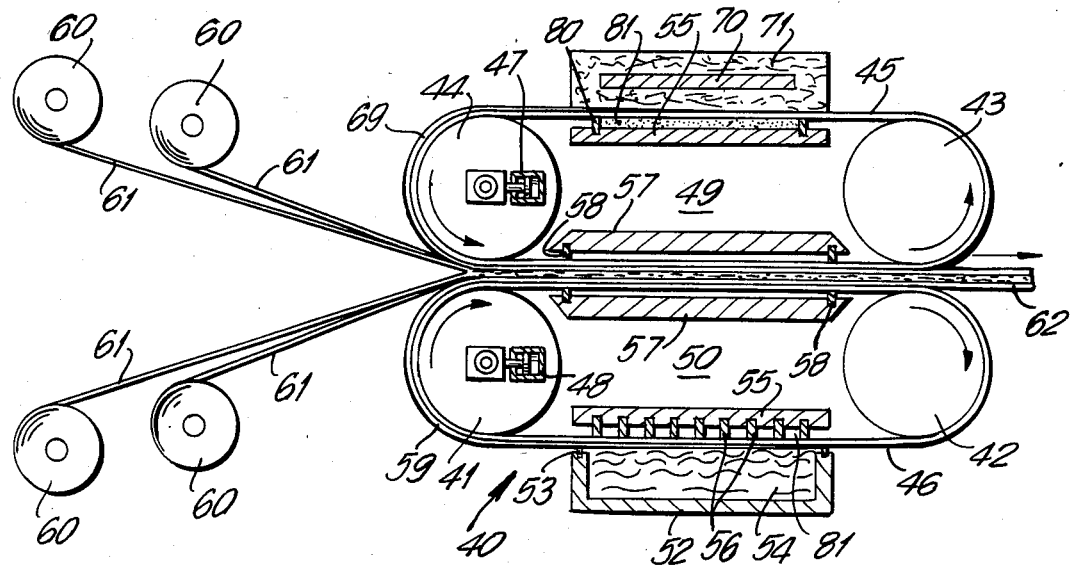
FIG. 3 is a schematic diagram showing a device for performing the process consisting of a double band press positioned on edge.

A further embodiment for preforming the inventive process can be seen in FIG. 3 where an ordinary double band press is shown in section along a horizontal plane, as it is utilized for the fabrication of decorative laminates. This double band press together with the roll-up and roll-off units is however installed rotated through 90° with respect to a longitudinal axis so that the wide side of the press bands now stands vertically, meaning the double band press stands edge up or upended.

This double band press 40 comprises two press band units 49, 50 lying next to each other in which two reversing drums each 41, 42 or 43, 44 are supported. An endless press band 45, 46 is stretched around two of these reversing drums, respectively, which again consists of a high tensile special steel. The tension of the press bands 45, 46 is applied by means of hydraulic cylinders 47, 48 which are fastened at the reversing drums 41, 44. The reversing drums move in accordance with the arrows so that the two press bands 45, 46 move counter to each other.

Between the two press bands 45, 46, the material web running from left to right in the drawing is molded with simultaneous application of pressure and heat. In this reaction zone 51, the applied pressure is produced hydraulically or mechanically by pressure plates 57 on the inner side of the press bands 45, 46 and is transmitted from there to the material web. In FIG. 3, only the hydraulic pressure transmission is shown. A fluid which can be subjected to pressure is introduced into the space between the pressure plate 57 and the inner sides of the press band, which space is bounded on the sides by seals 58.

At the side of the press band unit 50 facing away from the reaction zone 51, a trough 52 is located at the outer surface of the press band 46, whose width covers the entire broad side of the press band. This trough 52 is provided with seals 53 at the edges which rest against the press band 46 in a sliding manner. The electrolytic liquid 54 is located at the trough 52 which again consists of a solution of copper sulfate. The trough 52 is subjected to an underpressure so that, during movement of the press band 46 supported by the seals 53, no electrolytic liquid can exit from the trough. On the inner side of the press band 46, opposite the trough 52, a support plate 55 of preferably the same size as the trough 52 is fastened in the press stand. Gliding ledges 56 next to each other are located in this support plate 55 and are connected with it in a conductive manner, the length of these ledges being of the same magnitude as the broad side of the press band. The gliding ledges 56 consist of a metal and touch the press band 46 in a gliding fashion.

The support plate 55 is connected with the negative terminal of a constant voltage source so that the portion of the press band 46 contained in the electrolyte 54 acts as a cathode through the gliding ledges 56. The trough 52 is fabricated of a metal having good conductive properties and is connected with the positive terminal of the constant voltage source, whereby the trough 52 itself is switched as an anode. With this, a foil 59 consisting of copper is precipitated on the press band trunk located in the electrolyte, which press band is continuously moved through trough 52, whose maximum thickness is achieved when the press band trunk has reached the boundary of the trough 52 located on the left hand side as shown in the drawing. The copper foil 59 resting at the press band 46 is subsequently redirected at the reversing drum 41 and is introduced into the reaction zone 51.

Webs 61 are continuously pulled off and pushed through the double band press in between the two copper foils 59, 69 by several roll-off units 60 located in front of the double band press respective to the direction of movement of the material web, said roll-off units as well as the double band press being arranged to be vertically upright. These webs 61 again consist of a glass fiber tissue impregnated with epoxy resin. The number of the roll-off units 60 is a function of the desired structure of the core layer of the electrolaminate. In the reaction zone 51, the glass fiber webs are molded among themselves with two copper foils under the influence of heat into an electrolaminate 62 which, in the drawing, continuously leaves the double band press 40 on the right-hand side.

A further appropriate embodiment of the inventive process is shown in FIG. 3 in case of the double band unit 49 located on the left-hand side considered in feed direction. The galvanizing of the copper foil 69 upon the press band 45 occurs by means of the known tampon process. A plate 70 connected with a positive terminal of the direct voltage source and thus acting as an anode consisting of platinum is enveloped by a sponge-like felt tissue 71. This felt tissue has a specific width so that the distance of the anode 70 from the press band 45 is very accurately defined. The felt tissue is soaked with the electrolyte liquid consisting of copper sulfate. The press band 45 is again switched to the cathode as has already been described above. Since a very small distance between the anode 70 and the press band 45 is possible with the help of the felt tissue, there are obtained high current densities and with this high precipitation rates of copper upon the press band 45.

The felt tissue 71 simultaneously serves as a sort of vessel for the electrolyte liquid. Thus, complicated sealing devices can advantageously be avoided, such as are required in a trough-shaped bath 52, in order to prevent flowing out of the electrolyte liquid. In order to assure the temperature and constancy in the concentration of the electrolyte liquid, the electrolyte liquid can also be continuously moved by a pump through the felt tissue 71. Naturally, electrolytes can also be used which contain certain additives in order to achieve an improved precipitation of the copper. Such electrolyte liquids are in themselves known in galvanization processes utilizing the tampon process.

The described tampon process can also be utilized for the double band unit lying on the right side in the feed direction depicted in FIG. 3. Should it appear desirable, the devices according to FIGS. 1 and 2 can be equipped with such a felt tissue 71 instead of a trough with the electrolyte liquid.

Thus, it will be seen that the present invention is directed to a continuous process for fabrication of copper-lined laminates, in which the required copper foils are galvanically precipitated upon the press bands prior to passage through the reaction zone. Subsequently, these copper foils are conveyed by the press band in the direction of the reaction zone, where they are brought together with the resin impregnated laminated plastic webs and are molded in the reaction zone with the laminated plastic webs into a copper-lined laminate. The device for performing this process consists of the double band press installed vertically or end up, which comprises a cavity suitable for receiving the electrolyte for copper precipitation and on the side facing away from the reaction zone and an anode at the external side of the press band. In the area of this cavity, the press band is switched to be a cathode. The roll-off units for the laminated plastic webs are attached in front of the reversing drum located at the inlet into the reaction zone.

The various features of novelty which characterize the invention are pointed out with particularity in the claims annexed to and forming a part of this disclosure. For a better understanding of the invention, its operating advantages and specific objectives attained by its use, reference should be had to the drawings and descriptive matter in which there are illustrated and described the preferred embodiments of the invention.

What is claimed is:

1. A process for fabrication of copper-lined laminates comprising the steps of:
   galvanically depositing a copper layer on a portion of at least one of two endless press bands moving at equal speeds and arranged to define therebetween a reaction zone at which said press bands move generally parallel to each other;
   moving said portion of said at least one press band through said reaction zone;
   feeding into said reaction zone between said two press bands resin impregnated plastic webs to form therein a laminated structure consisting essentially of said plastic webs in said copper layer;
   curing said laminated structure by application of heat and pressure thereto in said reaction zone to mold said copper layer together with said plastic webs; and
   stripping said laminated structure from said press bands to form said copper-lined laminates.

2. A process according to claim 1, wherein said laminated structure is continuously stripped from said press bands at a location beyond said reaction zone taken in the feed direction of said press bands.

3. A process according to claim 1, wherein said laminated structure is subdivided into plates of a desired size after stripping from said press bands.

4. A process according to claim 1, wherein said laminated structure is formed into a flexible laminate and is rolled up into a storage reel after stripping from said press bands.

5. A process according to claim 1, wherein said copper layer deposited on said press band is pretreated prior to entering said reaction zone on its side facing the laminated plastics core in order to improve its adhesion upon the laminated plastic.

6. A process according to claim 5, wherein a brass application which is strongly susceptible to forming knots is applied on the side of the copper layer facing the laminated plastic core.

7. Apparatus for fabrication of copper-lined laminates comprising a pair of juxtaposed press band units each comprising three reversing drums and an endless press band strip arranged about said reversing drums for movement in a triangular path shaped as a right triangle, with said press bands being arranged so that they move parallel to each other during movement through one side of said triangular path to form a reaction zone therebetween, said reaction zone being arranged to extend vertically; galvanic bath means for precipitating copper on said press band strips including a trough suitable for receiving electrolytes therein and having an anode attached at at least one of said press band units at an external side of said press band strip along a part of said triangular path extending perpendicularly to said reaction zone wherein a surface of said press band strips constitutes a cathode, said part of said triangular path extending perpendicularly to said reaction zone having a size and position determined by the band surface constituting said cathode; and roll means having laminated plastic webs thereon arranged in the vicinity of said reaction zone at an upper end thereof for feeding said laminated plastic webs to between said press band strips in said reaction zone.

8. Apparatus for fabrication of copper-lined laminates comprising: a pair of juxtaposed press band units each comprising three reversing drums and an endless press band strip arranged around said reversing drum for movement in a triangular path shaped as a right triangle, with said press band strips being arranged so that they move parallel to each other during movement through one side of said triangular path to form a reaction zone therebetween, said reaction zone being arranged to extend vertically; galvanic bath means for precipitation of copper on said press band strips including a trough suitable for receiving electrolytes therein and having an anode attached at at least one of said press band units at an external side of said press band strips along a part of said triangular path extending perpendicularly to said reaction zone, with a cathode being formed by a part of the surface of said press band strips, said triangular path extending perpendicularly to said reaction zone having a size and position determined by the press band surface constituting said cathode; and roll means having laminated plastic webs thereon arranged in the vicinity of said reaction zone at a lower end thereof for feeding said laminated plastic webs to between said press band strips in said reaction zone.

9. Apparatus for fabrication of copper-lined laminates comprising a double band press having band strips lying opposite each other between which a reaction zone is formed with a galvanic bath for copper precipitation being provided, said double band press comprising two double band units each having two reversing rollers around which respectively one press band is slung, installed end-up in such a way that the wide side of the press bands points in a vertical direction with a cavity being provided for receiving electrolytes having an anode attached at at least one double band unit on the side facing away from said reaction zone at an external side of said press band whose size and position are determined by the band surface constituting a cathode with roll-off units for laminated plastic webs being arranged in an end-up fashion at a reversing drum of said double band press located at the inlet to said reaction zone with reference to the direction of motion of said press bands.

10. Apparatus according to claim 7 or 8, wherein said portion of said triangular path extending perpendicularly to said reaction zone extends horizontally.

11. Apparatus according to claim 7, 8 or 9, wherein said anode consists of a metal which is inert with respect to said electrolyte and wherein said electrolyte contains copper to be precipitated already as ions.

12. Apparatus according to claim 11, wherein the concentration as well as the temperature of said electrolyte is maintained constant by the addition of fresh electrolyte.

13. Apparatus according to claim 11, wherein said anode consists of lead.

14. Apparatus according to claim 11, wherein said anode consists of platinum.

15. Apparatus according to claim 11, wherein said electrolyte consists of a solution of copper sulfate.

16. Apparatus according to claim 7, 8 or 9, wherein said anode consists at least partially of copper.

17. Apparatus according to claim 7, 8 or 9, wherein said anode is designed to be plate-shaped and extends the same distance from said press band external side over the entire surface.

18. Apparatus according to claim 7, 8 or 9, wherein said trough receiving said electrolyte has edges facing said press band which are sealed by means of seals to prevent electrolyte from flowing therefrom.

19. Apparatus according to claim 18, wherein said trough consists of a metal inert with respect to said electrolyte and is switched as an anode.

20. Apparatus according to claim 7, 8 or 9, wherein said trough containing said electrolyte consists of a felt-like tampon enveloping said anode and having pores with electrolyte located therein and containing copper to be precipitated in the form of ions.

21. Apparatus according to claim 7, 8 or 9, wherein a metallic plate is attached at a portion of the press band forming the cathode arranged a small distance with respect to the inner side of the press band which is connected with a negative terminal of a voltage source with current flow from the plate to the press band occurring through a metallic liquid contained in a gap between the press band inner side and the plate.

22. Apparatus according to claim 21, wherein mercury is used as said metallic liquid.

23. Apparatus according to claim 21, wherein a gap between said plate and said press band inner side has an edge which is sealed by means of seals.

24. Apparatus according to claim 22, wherein a gap between said plate and said press band inner side has an edge which is sealed by means of seals.

* * * * *